United States Patent
Ito et al.

(10) Patent No.: US 8,362,456 B2
(45) Date of Patent: Jan. 29, 2013

(54) RESISTANCE CHANGE ELEMENT AND SEMICONDUCTOR DEVICE INCLUDING THE SAME

(75) Inventors: Kimihiko Ito, Tokyo (JP); Hiroshi Sunamura, Tokyo (JP); Yuko Yabe, Tokyo (JP)

(73) Assignee: NEC Corporation, Tokyo (JP)

( * ) Notice: Subject to any disclaimer, the term of this patent is extended or adjusted under 35 U.S.C. 154(b) by 576 days.

(21) Appl. No.: 12/595,662

(22) PCT Filed: Mar. 21, 2008

(86) PCT No.: PCT/JP2008/055236
§ 371 (c)(1),
(2), (4) Date: Oct. 13, 2009

(87) PCT Pub. No.: WO2008/132899
PCT Pub. Date: Nov. 6, 2008

(65) Prior Publication Data
US 2010/0059730 A1    Mar. 11, 2010

(30) Foreign Application Priority Data
Apr. 17, 2007   (JP) .................................. 2007-108317

(51) Int. Cl.
*H01L 47/00*    (2006.01)
(52) U.S. Cl. ......... 257/4; 257/1; 257/2; 257/5; 257/314; 257/326; 365/148
(58) Field of Classification Search .................. 365/148; 257/1, 2, 4, 5, 314, 326
See application file for complete search history.

(56) References Cited

U.S. PATENT DOCUMENTS
7,446,391 B2 * 11/2008 Odagawa et al. .............. 257/536
2006/0054950 A1 * 3/2006 Baek et al. ..................... 257/295

FOREIGN PATENT DOCUMENTS
JP       7-263647 A       10/1995
JP    2004363604 A       12/2004
(Continued)

OTHER PUBLICATIONS
International Search Report for PCT/JP2008/055236 mailed Jun. 17, 2008.
(Continued)

*Primary Examiner* — N Drew Richards
*Assistant Examiner* — Yu-Hsi D Sun

(57) ABSTRACT

To use a resistance change element having an MIM structure, which is obtained by stacking a metal, a metal oxide, and a metal, as a switching element, it is necessary to achieve OFF resistance higher than that required in a memory element by a factor of at least 1000. On the other hand, when a resistance change element is used as a memory element and when the difference between the ON resistance and the OFF resistance is a large value, high performance, for example, a short read-out time, can be achieved. The present invention therefore provides a resistance change element capable of maintaining low ON resistance and achieving high OFF resistance. High OFF resistance can be achieved while low ON resistance is maintained by adding a second metal that is not contained in a metal oxide, which is a resistance change material, the second metal being capable of charge-compensating for metal deficiency or oxygen deficiency.

8 Claims, 4 Drawing Sheets

FOREIGN PATENT DOCUMENTS

| | | |
|---|---|---|
| JP | 2005236003 A | 9/2005 |
| JP | 2006245322 A | 9/2006 |
| JP | 2007027537 A | 2/2007 |
| JP | 2007053125 A | 3/2007 |
| JP | 2007053309 A | 3/2007 |

OTHER PUBLICATIONS

J. F. Gibbons et al., "Switching Properties of Thin NiO Films", Solid-State Electronics Pergamon Press 1964, vol. 7, pp. 785-797, 1964.

* cited by examiner (a) (b)

RESISTANCE CHANGE ELEMENT AND SEMICONDUCTOR DEVICE INCLUDING THE SAME

FIELD OF THE INVENTION

The present invention relates to a resistance change element that can be used as a nonvolatile memory element or a switching element, and a semiconductor device including the resistance change element.

DESCRIPTION OF THE RELATED ART

As represented by flash memories and SONOS (silicon oxide nitride oxide semiconductor) memories, nonvolatile memories currently dominating the market are achieved by using a technique that make use of electric charges accumulated in an insulating film disposed above the channel to change the threshold voltage of a semiconductor transistor. Although miniaturization is essential to increase the capacity, it has been difficult to miniaturize even a semiconductor transistor which does not have charge accumulation function. To address the problem, studies have been conducted to further increase capacity by allowing a transistor to have only a switching function of selecting a memory cell to and from which data is written and read, separating a storage element like DRAM, and miniaturizing the transistor and the storage element separately.

To miniaturize the information storage function continuously, it is conceivable to form the memory element by using a resistance change element which has an electronic element capable of switching its electric resistance among two or more values when some type of electric stimulus is applied. In a system used in DRAM, in which a charge is accumulated in a capacitor, the signal voltage inevitably decreases as the amount of accumulated charge decreases due to miniaturization. On the other hand, electric resistance may generally have a finite value even in a miniaturized resistance change element in many cases. It is therefore believed that further miniaturization will be realized by a principle in which the resistance can be changed and by using a material that can allow the principle to work.

The operation of the resistance change element described above is in principle applicable to a switch that switches its state between a low-resistance ON state and a high-resistance OFF state and, for example, interconnects wiring lines 1 and 2 shown in FIG. 1 as well as a switching device that changes an in-LSI wiring configuration.

However, the performance required for a resistance change element when it is used as a memory element is different from that required when it is used as a switch that connects wiring lines. When a resistance change element is used as a memory element, the memory element is connected in series to a transistor, a diode, or any other active element. In this case, the ON-state resistance only needs to be approximately 1 kΩ, whereas the OFF-state resistance only needs to be approximately 100 kΩ. That is, a two-digit resistance change may be adequate. On the other hand, a switch inserted between the wiring lines, such as those shown in FIG. 1, is required to have low ON resistance equivalent to the resistance of the wiring lines (100Ω or lower, for example) and high OFF resistance (100 MΩ or higher, for example) for reliably blocking a signal.

There is a plurality of existing technologies for changing electric resistance by using an electric stimulus. The most intensively studied technology among them is a storage device which uses a chalcogenide semiconductor whose crystalline phase (amorphous or crystalline) is switched by conducting a pulsed current to utilize a two- to three-digit difference in electric resistance between the two crystalline phases. A storage device of this type is generally called a phase-change memory.

On the other hand, a metal/metal oxide/metal (hereinafter referred to as MIM) structure in which a metal oxide is sandwiched between electrodes has also been known to change its resistance when a high voltage or current is applied. The present invention relates to an MIM element of this type.

FIG. 2 is a schematic cross-sectional view of an MIM resistance change element. For example, as Non-patent Document 1 has reported a resistance change element made of nickel oxide (NiO), a voltage- or current-induced resistance change phenomenon in a variety of materials has been studied and reported in the period from 1950s to 1960s. A phase-change memory typically not only involves a change in the crystalline phase accompanied by a large change in volume but also requires local heating to a few hundred degrees centigrade for a few tens of nanoseconds, although this is a very short time, in order to change the crystalline phase. On the other hand, MIM resistance change elements have drawn attention again in recent years because there has been no report clearly indicating that an MIM resistance change element is required to be heated to a high temperature of a few hundred degrees centigrade.

FIG. 3 shows the current-voltage characteristic of an MIM resistance change element. The element, which maintains a high-resistance OFF state or a low-resistance ON state in a nonvolatile manner even when the power is turned off, can switch its resistance state between the above two states as required when a predetermined voltage/current stimulus is applied.

FIG. 3 shows an example of the current-voltage characteristic in the ON state and the OFF state. When a voltage Vt1 or higher is applied to the resistance change element in the OFF state which has high resistance, the resistance change element gets into the ON state which have low resistance, which electric characteristic is shown in FIG. 3(b). When a voltage Vt2 or higher is applied to the resistance change element in the ON state shown in FIG. 3(b), the resistance change element gets into the high-resistance OFF state, which electric characteristic is shown in FIG. 3(a). Therefore, the resistance change element is capable of repeatedly switching its state between the high-resistance OFF state and the low-resistance ON state, and this characteristic may be used for a nonvolatile memory element or a nonvolatile switching element for circuit switching.

In an MIM resistance change element containing a metal oxide, current paths responsible for the low-resistance ON state are not formed throughout the space between the electrode surfaces, as diagrammatically shown in FIG. 4. The MIM resistance change element is characterized in that each local current path 4 having a diameter of approximately a few nanometers, which can be approximately a few tens of nanometers at the maximum, maintains the low-resistance ON state. FIG. 5 shows the dependence of the ON state resistance on the electrode area in a (parallel-plate) resistance change element produced by using NiO as the resistance change material, as described in the paper found in Non-patent Document 1, and sandwiching the NiO by electrodes. FIG. 5 shows that the resistance in the low-resistance ON state hardly depends at all on the electrode area, clearly indicating that the current paths that have been locally formed are responsible for the ON state. [Non-patent Document 1] Solid State Electronics, Vol. 7, pp. 785-797, 1964

DISCLOSURE OF THE INVENTION

Problems to be Solved by the Invention

On the other hand, a primary example of resistance change material that shows a voltage-induced resistance change characteristic is a transition metal oxide, which typically has large ON-state resistance. However, to use the resistance change element as a switching element, the resistance in the OFF state (hereinafter abbreviated to OFF resistance) needs to be at least 1000 times higher than the OFF resistance required in a memory element, as described above.

When a resistance change element is used as a memory element, high performance, such as a short readout time, can be achieved if the difference between the resistance in the ON state (hereinafter abbreviated to ON resistance) and the OFF resistance can be increased.

The present invention therefore provides a resistance change element that maintains low ON resistance and achieves high OFF resistance.

Electric conduction in the OFF state is determined by electric conduction in the metal oxide (resistance change material) and electric conduction of the interface between the electrodes. The object of the present invention is to achieve high OFF resistance without changing the ON resistance by controlling electric conduction in the resistance change material.

Means for Solving the Problems

NiO, titanium oxide ($TiO_2$), and other similar metal oxides that have been known as resistance change materials are likely to have crystal defects and it is difficult to combine any of the metal elements with oxygen stoichiometrically. For example, NiO disadvantageously tends to produce a large amount of Ni deficiency. Since Ni deficiency effectively serves as divalent acceptors, which effectively convert the surrounding Ni into trivalent Ni and produce holes, this results in reduction in electric resistance. Conversely, in the case of $TiO_2$, oxygen deficiency tends to exceed Ti deficiency. Since oxygen deficiency serves as donors, electronic conduction occurs. To control the composition nonstoichiometry described above, it is necessary to control the atmosphere and temperature in an extremely delicate manner, and incorporating such control in actual LSI processes requires a significant challenge.

According to the present invention, high OFF resistance can be achieved while low ON resistance is maintained by adding a second metal that is not comprised in a metal oxide as the resistance change material, but charge-compensates metal deficiency or oxygen deficiency.

A resistance change element according to the present invention comprises a resistance change material between electrodes, the resistance of the resistance change material changes with voltage, wherein the resistance change material contains an oxide of a first metal and a second metal contained in the oxide of the first metal, the second metal being capable of compensating for the charge produced by metal deficiency or oxygen deficiency in the oxide of the first metal.

A semiconductor device according to the present invention is characterized in that it includes the resistance change element.

Advantage of the Invention

The present invention can provide a resistance change element that achieves high OFF resistance while maintaining low ON resistance. The resistance change element according to the present invention can be used not only as a memory element but also as a switching element.

Figure 1:
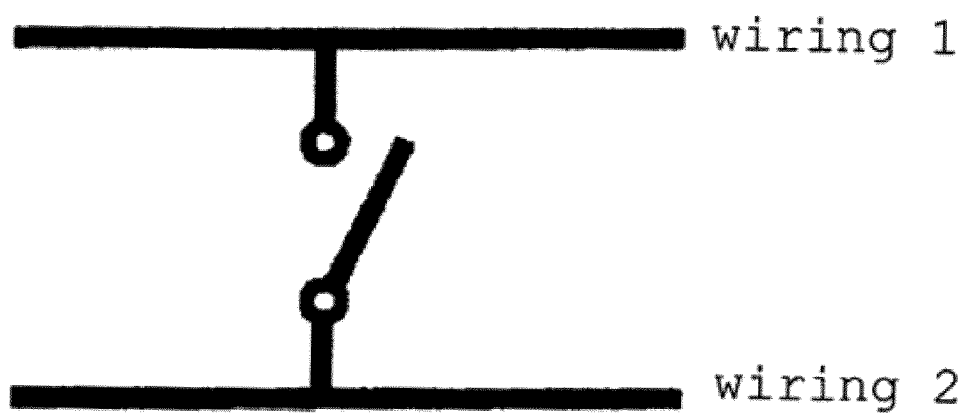
FIG. 1 shows a switch that interconnects two wiring lines.
Figure 2:
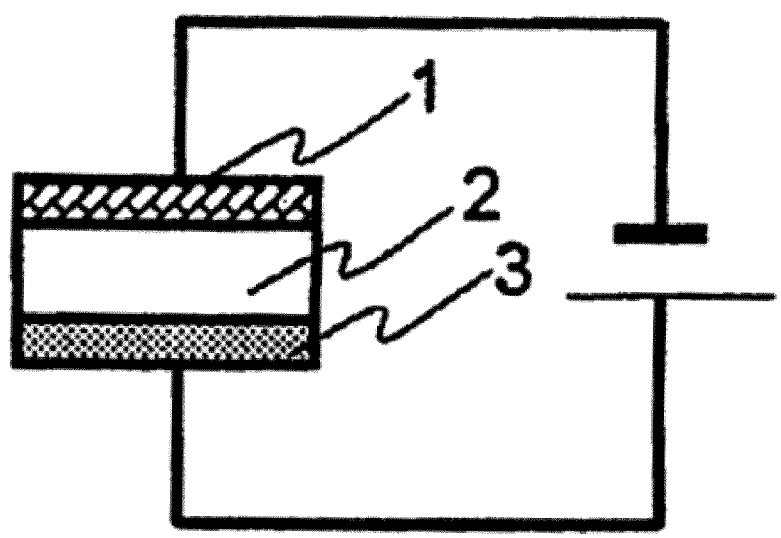
FIG. 2 is a basic, schematic cross-sectional view of an MIM resistance change element.
Figure 3:
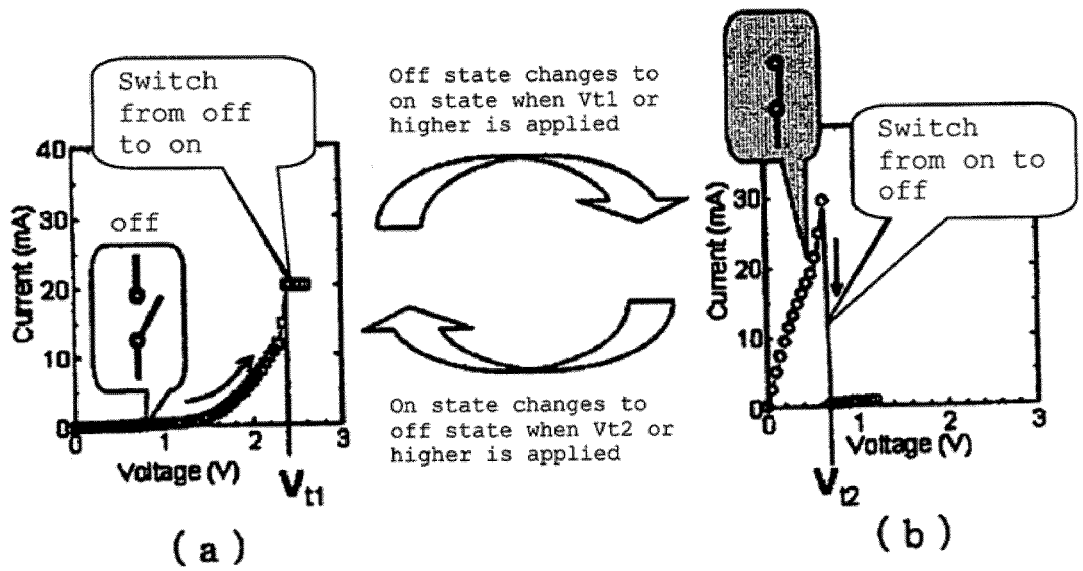
FIG. 3 shows a basic resistance change characteristic of an MIM resistance change element made of NiO resistance change material.
Figure 4:
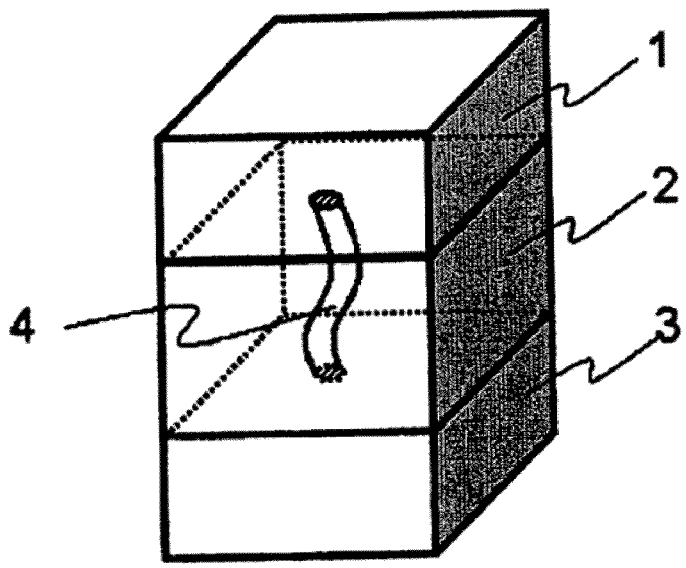
FIG. 4 is a perspective view of an MIM resistance change element diagrammatically showing a local current path responsible for an ON state.
Figure 5:
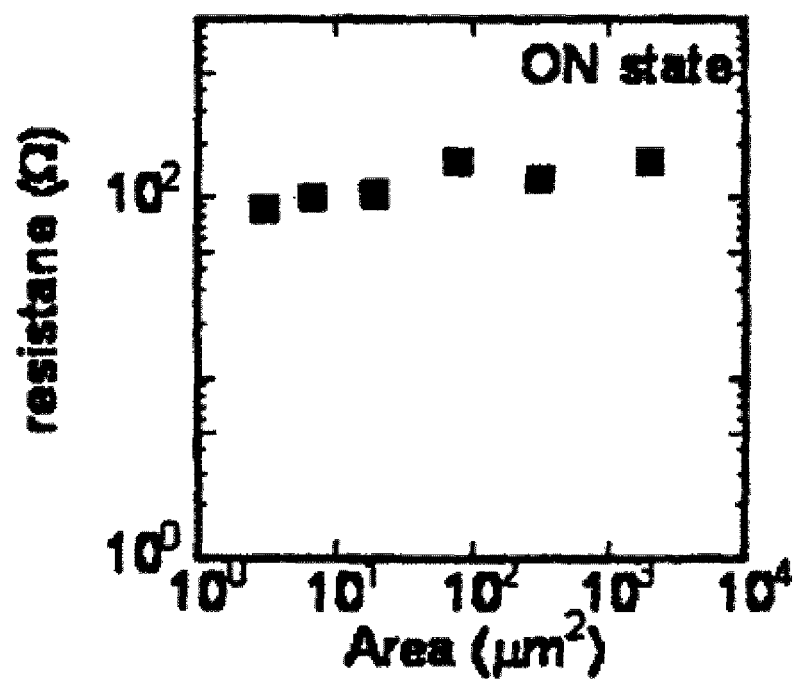
FIG. 5 shows the dependence of ON resistance of a parallel-plate MIM resistance change element on the electrode area.

DESCRIPTION OF SYMBOLS 1 upper electrode
2 resistance change material made of metal oxide
3 lower electrode
4 current path responsible for ON state in resistance change element
10 lower insulating layer
11 lower wiring line
12 lower electrode
13 oxide film made of first metal and containing second metal (resistance change material)
14 upper electrode
15 upper insulating layer
16 upper wiring line
111 gate electrode in transistor formed on semiconductor substrate
112 drain in transistor formed on semiconductor substrate
113 source in transistor formed on semiconductor substrate
114 wiring line used as bit line when resistance change element is operated as nonvolatile memory element
115 wiring line
116 resistance change element
117 barrier conductor
118 barrier insulator

DESCRIPTION OF THE PREFERRED EMBODIMENTS

A resistance change element according to the present invention that can be used as a memory element or a switching element will be described below with reference to the accompanying drawings. The present invention is not limited to the following exemplary embodiments.

Figure 6:
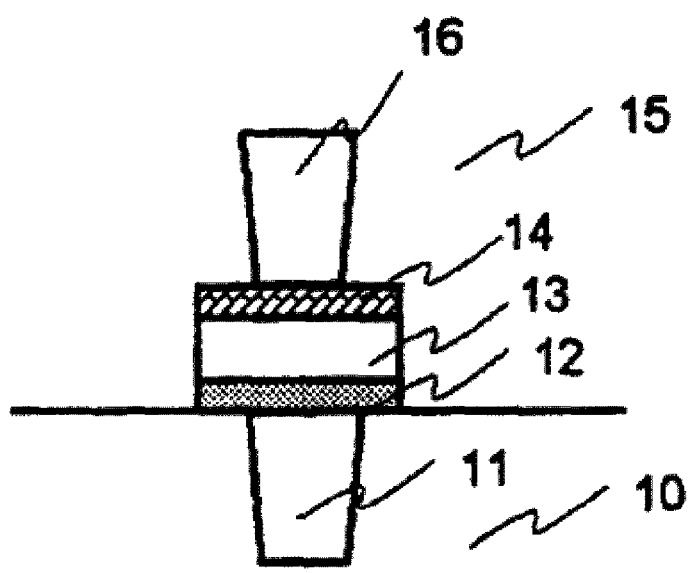
FIG. 6 is a schematic cross-sectional view of a resistance change element showing a first exemplary embodiment according to the present invention.

FIG. 6 is a schematic cross-sectional view of a resistance change element according to the present invention. The resistance change element according to the present invention is an MIM element and has a structure in which an oxide film of a first metal (resistance change material) that contains a second metal is sandwiched between metal electrodes.

A method for producing the resistance change element will be briefly described below. For example, consider the following initial state: a lower insulating layer 10 is provided on a wiring multilayer, and a lower wiring line 11 is disposed in a thin hole formed in lower insulating layer 10. Thereafter, lower electrode 12 is formed on lower wiring line 11, and then oxide film of a first metal 13 that contains a second metal is formed.

A method for forming the oxide film of a first metal that contains a second metal is not limited to a specific one. For example, the oxide film can be formed by CVD in which raw materials of the first and second metals are forced to flow through a reaction chamber along with an oxidant to cause a gas-phase reaction. Alternatively, for example, the method may be sputtering using a target obtained by sintering a mixture of a first metal oxide and a second metal or a sol-gel method in which the raw material that have been mixed in advance is spin-coated.

Thereafter, CVD or sputtering is used to form upper electrode 14. Photolithography is used to mask a portion required to be masked, and dry etching or any other suitable method is used to remove unnecessary portions of lower electrode 12, oxide film of first metal 13 that contains the second metal, and upper electrode 14. Thereafter, upper wiring line 16 necessary to make electrical contact with upper electrode 14 is disposed via upper insulating layer 15. A complete device shown in FIG. 6 is thus provided.

The material of lower electrode 12 or upper electrode 14 is not limited to a specific material, but can be materials that have been conventionally used for the electrodes in an MIM element. For example, aluminum (Al), copper (Cu), titanium nitride (TiN), tungsten nitride (WN), tantalum nitride (TaN), ruthenium (Ru), iridium (Ir), platinum (Pt), silver (Ag), gold (Au), nickel (Ni), cobalt (Co), or iron (Fe) can be used. Alternatively, a film obtained by stacking any of the materials described above can be used.

The first metal may be any metal having an oxide whose resistance changes with the voltage applied between the electrodes. Examples of the first metal may comprise nickel (Ni), copper (Cu), manganese (Mn), cobalt (Co), vanadium (V), iron (Fe), titanium (Ti), zirconium (Zr), hafnium (Hf), tantalum (Ta), tungsten (W), molybdenum (Mo), ruthenium (Ru), and mixtures thereof.

The second metal may be any metal that can charge-compensate for the metal deficiency or oxygen deficiency in the first metal oxide. For example, NiO tends to produce Ni deficiency. Since a Ni deficiency effectively serves as divalent acceptors, which effectively convert the surrounding Ni into trivalent Ni and produce holes, this results in a reduction in electric resistance. Conversely, in the case of $TiO_2$, oxygen deficiency tends to exceed Ti deficiency. Since oxygen deficiency serves as donors, electronic conduction occurs. Therefore, for example, when the first metal is Ni, Cu, Mn, Co, V, Fe, or any other metal whose oxide tends to produce holes, the second metal can comprise Ti, Zr, Hf, Ta, W, Mo, and any other metal whose oxide tends to produce electrons. On the other hand, when the first metal comprises Ti, Zr, Hf, Ta, W, Mo, or any other metal whose oxide tends to produce electrons, the second metal can be selected from Ni, Cu, Mn, Co, V, Fe, or any other metal whose oxide tends to produce holes. The additive second metal is not limited to one element, but a plurality of elements can be added simultaneously. Adding a second metal that charge-compensates for the first metal oxide allows high resistance in the OFF state to be further increased while low resistance in the ON state is maintained. The term "charge compensation" used herein means that the total amount of charge in the resistance change material is reduced to zero or brought to a value that is nearly zero. In particular, the object is to reduce the amount of charge carriers by adding an element having a stable ionized state whose sign is the same as that of the charge carriers that are produced by defects.

It is important to achieve low ON resistance and high OFF resistance at the same time by adding an appropriate amount of second metal so as not to impede the formation of local current paths responsible for the ON-resistance state. Therefore, the amount of the second metal to be added preferably ranges from 0.01 mol % to 50 mol %, more preferably from 0.5 mol % to 10 mol %, particularly preferably from 1 mol % to 5 mol %.

The thickness of the oxide film of the first metal that contains the second metal preferably ranges from 1 nm to 200 nm, more preferably from 5 nm to 100 nm, particularly preferably from 10 nm to 50 nm, not only from the viewpoint of the operating voltage of the resultant resistance change element when implemented on an LSI, but also from the viewpoint of preventing the resistance states from being affected by external conditions.

The wiring lines may be word lines or bit lines. When the lower electrode is connected to a word line, the upper electrode is connected to a bit line. Conversely, the lower electrode is connected to a bit line, whereas the upper electrode is connected to a word line.

As described above, the resistance change element according to the present invention allows the high-resistance OFF state and the low-resistance ON state to be changed in a reversible manner and can be used as a memory element and as a switching element.

(First Exemplary Embodiment)

Figure 7:
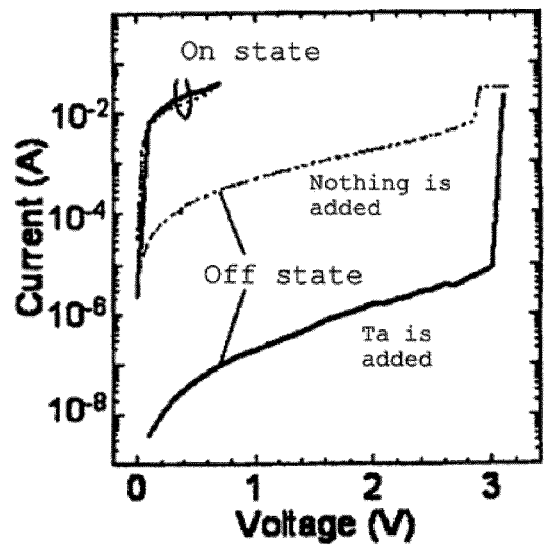
FIG. 7 shows the current-voltage characteristic of a resistance change element obtained by adding 10 mol % of Ta to NiO.

FIG. 7 shows the current-voltage characteristic in the ON state and the OFF state when 10 mol % of Ta was added to nickel oxide (NiO). The upper and lower electrodes were made of Ru.

The upper and lower electrodes and the resistance change film were formed by sputtering in the present experiment. In particular, the resistance change film was formed by using a sintered target made of NiO to which Ta was added. The film thickness was approximately 80 nm. The lower electrode and the resistance change film were not processed, but the upper electrode was shaped into a circle having a diameter of 100 μm.

The characteristic indicated by the dashed lines is the current-voltage characteristic of the resistance change element made of NiO to which no Ta was added. FIG. 7 indicates that the current-voltage characteristic in the ON state remains unchanged irrespective of whether or not Ta was added, but adding Ta can increase the OFF resistance by at least triple digits, for example, when compared at a current of 1 V. Therefore, provided that the same configuration is employed, the OFF resistance achieved by the resistance change element made of NiO to which Ta is added is higher by at least triple digits than that achieved by the resistance change element made of NiO to which no Ta is added.

(Second Exemplary Embodiment)

While the present invention is significant for a switch that controls interconnection between wiring lines, the present invention may be applied to a memory element connected in series to a semiconductor transistor, a diode, or any other active element. When the present invention is applied to a memory element and when the difference between the ON resistance and the OFF resistance is large, high performance, for example, a short readout time, can be achieved.

Figure 8:
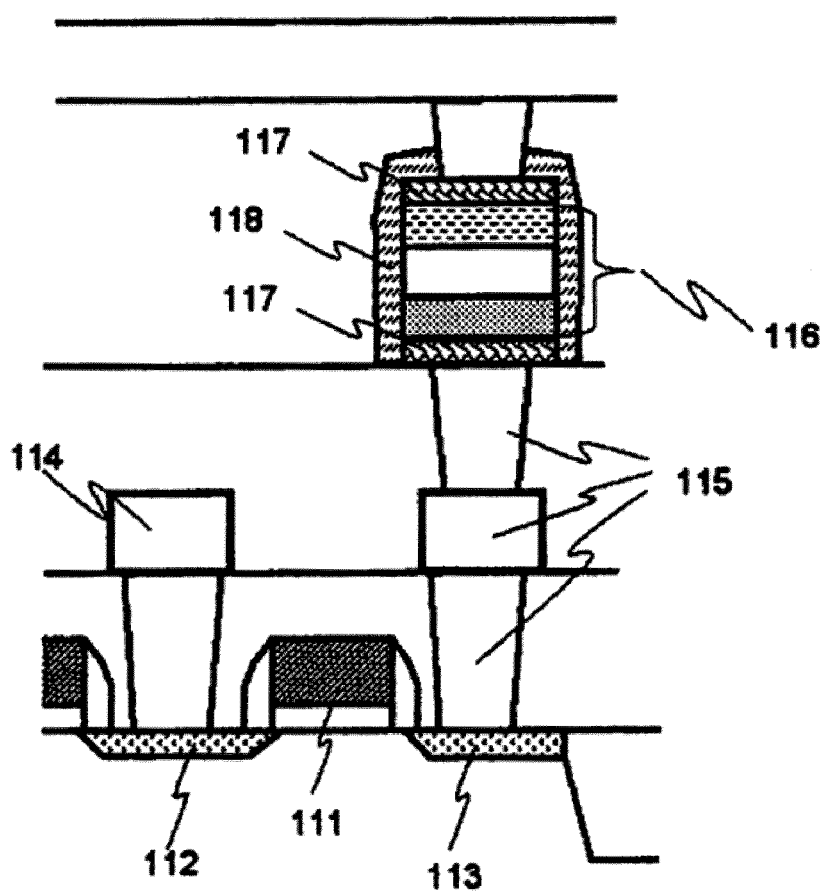
FIG. 8 is a schematic cross-sectional view of a semiconductor storage device including a resistance change element according to the present invention.

FIG. 8 shows an exemplary embodiment of a semiconductor storage device having a configuration in which the resistance change element of the present invention is formed on a semiconductor transistor. A semiconductor substrate made of silicon (Si) or any other suitable element is first prepared. A transistor is formed on the semiconductor substrate, and a wiring line 115 made of W, Al, Cu, or any other suitable element is formed on the drain 113 of the transistor in such a way that the wiring line 115 extends upward away from the substrate. A resistance change element 116 is then formed above the wiring line 115 via a barrier conductor 117 that prevents the elements contained in the resistance change element from diffusing. The barrier conductor 117 can be made of titanium nitride (TiN), tantalum nitride (TaN), tungsten nitride (WN), molybdenum nitride (MoN), or any other suitable compound. As shown in FIG. 8, the portion of the resistance change element that is not in contact with barrier conductor 117 may be coated with barrier insulator 118. Barrier insulator 118 can be made of silicon nitride ($Si_3N_4$), silicon carbonitride (SiCN), silicon carbide (SIC), aluminum oxide ($Al_2O_3$), or any other suitable compound.

As an applied example, when the resistance change element is operated as a nonvolatile memory element, wiring line 114 formed on the side where source 112 of the transistor is located can be used as a bit line. After the bit line is charged in advance with the transistor turned off by using gate 111, gate 111 is used to open the transistor to discharge the charge through resistance change element 116. The resistance state of resistance change element 115 changes the time constant determined by the product of the resistance of the resistance change element and the capacitance of the bit line. Therefore, after a predetermined period has elapsed, reading the potential of the bit line allows the resistance state of resistance change element 116 to be determined.

The present application is the National Phase of PCT/JP2008/055236, filed Mar. 21, 2008, which claims the priority based on Japanese Patent Application No. 2007-108317 filed on Apr. 17, 2007, and all of the disclosure of which is hereby incorporated.

The present invention has been described with reference to the exemplary embodiments, but the present invention is not limited thereto. A variety of changes that can be understood by those skilled in the art can be made to the configurations and details of the present invention within the scope thereof.

What is claimed is:

1. A resistance change element comprising a resistance change material between electrodes, the resistance of the resistance change material changes with voltage,
    wherein the resistance change material comprises an oxide of a first metal and also comprises a second metal, and
    the second metal is capable of compensating for the charge produced by metal deficiency or oxygen deficiency in the oxide of the first metal,
    the second metal comprises at least one of Ti, Zr, Hf, Ta, W and Mo.

2. The resistance change element according to claim 1,
    wherein the first metal comprises at least one of Ni, Cu, Mn, Co, V, and Fe.

3. A semiconductor device characterized in that the semiconductor device includes the resistance change element according to claim 1, that is electrically connected to a transistor formed on a semiconductor substrate or a wiring line.

4. The semiconductor device according to claim 3,
    wherein an electrode of the resistance change element is electrically connected to a source or drain region of the transistor formed on the semiconductor substrate.

5. The semiconductor device according to claim 4,
    wherein the electrode of the resistance change element electrically connected to the source or drain region of the transistor is electrically connected via a barrier conductor.

6. The semiconductor device according to claim 5,
    wherein the portion of the resistance change element that is not in contact with the barrier conductor is covered with a barrier insulator.

7. The semiconductor device according to claim 4,
    wherein the electrode of the resistance change element is connected to a metallic material that extends from the source or drain region of the transistor.

8. The semiconductor device according to claim 3,
    wherein the resistance change element functions as a nonvolatile memory element.

* * * * *